United States Patent
Sakamoto (10) Patent No.: US 9,351,349 B2
(45) Date of Patent: May 24, 2016

(54) ORGANIC EL DEVICE HAVING IMPROVED SEALING PROPERTY

(71) Applicant: Panasonic Corporation, Osaka (JP)

(72) Inventor: Gosuke Sakamoto, Kyoto (JP)

(73) Assignee: PANASONIC CORPORATION, Osaka (JP)

(*) Notice: Subject to any disclaimer, the term of this patent is extended or adjusted under 35 U.S.C. 154(b) by 168 days.

(21) Appl. No.: 14/309,011

(22) Filed: Jun. 19, 2014

(65) Prior Publication Data

US 2014/0300270 A1 Oct. 9, 2014

Related U.S. Application Data

(63) Continuation of application No. PCT/JP2013/004461, filed on Jul. 22, 2013.

(30) Foreign Application Priority Data

Jul. 26, 2012 (JP) ................. 2012-165661

(51) Int. Cl.
*H01L 33/00* (2010.01)
*H05B 33/04* (2006.01)
*H01L 51/52* (2006.01)
*H05B 33/10* (2006.01)

(52) U.S. Cl.
CPC ............ *H05B 33/04* (2013.01); *H01L 51/5253* (2013.01); *H05B 33/10* (2013.01); *H01L 2251/5338* (2013.01)

(58) Field of Classification Search
CPC .............. H05B 33/10; H01L 51/5253; H01L 2251/5338
See application file for complete search history.

(56) References Cited

U.S. PATENT DOCUMENTS 6,970,219 B1 11/2005 Hermann
8,159,127 B2 4/2012 Izumi
(Continued)

FOREIGN PATENT DOCUMENTS

CN 1495475 5/2004
CN 1655370 8/2005
(Continued)

OTHER PUBLICATIONS

U.S. Appl. No. 14/375,506 to Kazuyuki Yamae et al., filed Jul. 30, 2014.
(Continued)

*Primary Examiner* — Tracie Y Green
(74) *Attorney, Agent, or Firm* — Greenblum & Bernstein, P.L.C.

(57) ABSTRACT

An organic EL device including an organic EL portion, wiring, and an externally-connecting terminal, which are disposed above a substrate having flexibility. The substrate has a first region above which the organic EL portion is disposed, a second region above which the terminal is disposed, and a bend portion between the first and second regions. The bend portion corresponds to a predetermined portion of the organic EL device at which the organic EL device is to be bent. The organic EL portion is covered by an inorganic sealing film, and the inorganic sealing film is covered by a resin sealing film. An end of the inorganic sealing film in a direction of the terminal does not extend over the bend portion towards the terminal, and an end of the resin sealing film in the direction of the terminal extends over the bend portion towards the terminal.

7 Claims, 7 Drawing Sheets

(56) References Cited

U.S. PATENT DOCUMENTS

| | | | |
|---|---|---|---|
| 2004/0121628 A1 | 6/2004 | Hinata et al. | |
| 2005/0046346 A1 | 3/2005 | Tsuchiya et al. | |
| 2006/0139555 A1* | 6/2006 | Janssen | H01L 51/5246 349/153 |
| 2006/0273304 A1* | 12/2006 | Cok | H01L 51/0096 257/40 |
| 2008/0142791 A1 | 6/2008 | Kim et al. | |
| 2010/0301743 A1 | 12/2010 | Kodama et al. | |
| 2010/0320909 A1 | 12/2010 | Izumi | |
| 2013/0092918 A1 | 4/2013 | Okumoto et al. | |
| 2015/0194636 A1* | 7/2015 | Okumura | H01L 51/56 438/34 |

FOREIGN PATENT DOCUMENTS

| | | |
|---|---|---|
| CN | 101202329 | 6/2008 |
| CN | 101930992 | 12/2010 |
| JP | 2003-257325 | 9/2003 |
| JP | 2003-280546 | 10/2003 |
| JP | 2005-062627 | 3/2005 |
| JP | 2010-067355 | 3/2010 |
| JP | 2011-008969 | 1/2011 |
| WO | 2006/046679 | 5/2006 |

OTHER PUBLICATIONS

International Search Report (ISR) in International Patent Application No. PCT/JP2013/004461, dated Aug. 13, 2013.

Office Action from State Intellectual Property Office (SIPO) of the People's Republic of China in Chinese Patent Application No. 201380004431.9, dated Dec. 30, 2015, together with an English language translation.

* cited by examiner

ORGANIC EL DEVICE HAVING IMPROVED SEALING PROPERTY

CROSS REFERENCE TO RELATED APPLICATION

This is a continuation application of PCT Application No. PCT/JP2013/004461 filed Jul. 22, 2013, designating the United States of America, the disclosure of which, including the specification, drawings and claims, is incorporated herein by reference in its entirety.

TECHNICAL FIELD

The present disclosure is related to the structure of a device using an organic electroluminescent element (such a device hereinafter referred to as an "organic EL device"), and in particular, to the structure of sealing provided to an organic EL device.

BACKGROUND ART

Organic EL devices have various advantages owing to their capability of emitting light by themselves. For example, organic EL devices do not require backlights, have a wide viewing angle, and realize high-speed response. Further, organic EL devices having reduced thickness and reduced power consumption can be readily realized. One example of an organic EL device is an organic EL display device. Organic EL display devices are attracting much attention as the display panel of the next generation.

A typical display panel according to conventional technology has a structure where a display unit and an external drive circuit for driving the display panel are disposed on a glass substrate, and wiring is provided to connect the display unit and the external drive circuit. Thus, voltage from the external drive circuit is provided to the display unit. Here, the connection between the display unit and the external drive circuit, via wiring, can be realized in various forms. For example, Patent Literature 1 proposes a structure including a flexible print circuit (hereinafter referred to as an "FPC") for connecting (i) an external drive circuit and (ii) a substrate having disposed thereon a display unit and an externally-connecting terminal connected to the display unit.

Figure 7:
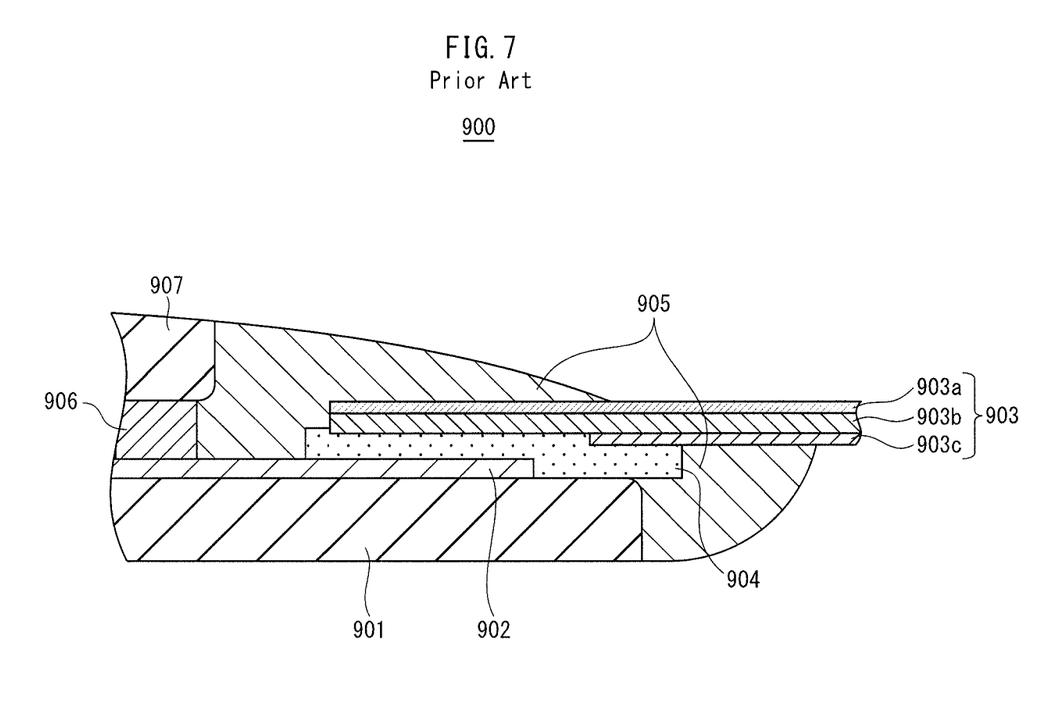
FIG. 7 is a cross-sectional diagram illustrating a connection region of a conventional display panel and neighboring regions, the connection region being for connection with an external drive circuit.

FIG. 7 illustrates the structure of the conventional display panel disclosed in Patent Literature 1. In specific, FIG. 7 is a cross-sectional view illustrating a connection region of the display panel and neighboring regions. At the connection region, the FPC and the substrate are connected. In specific, a display panel 900 disclosed in Patent Literature 1 includes: a glass substrate 901; an externally-connecting terminal 902 disposed on the glass substrate 901; and an FPC 903 for connecting the externally-connecting terminal 902 with an external drive circuit. In the display panel 900, the externally-connecting terminal 902 and the FPC 903 are connected via an anisotropic conductive adhesive 904. The display panel 900 further includes: an adhesive 905; and sealing members 906 and 907. Note that typically, the external drive circuit is disposed on a surface of the glass substrate 901 opposite a surface thereof on which a display unit is disposed.

The FPC 903 is composed of: a base film 903a; connection wiring 903b; and a cover film 903c. The FPC 903 has flexibility, and thus, can be folded back. Accordingly, when folded back, the FPC 903, excluding the portion thereof in adhesion with the anisotropic conductive adhesive 904, can be brought to be on the same side of the glass substrate 901 as the external drive circuit. Thus, connection between the display unit and the external drive circuit can be achieved.

Patent Literature 2 proposes a display panel including a plastic substrate instead of a glass substrate, which is typically included in display panels. The inclusion of a substrate having flexibility, i.e., a plastic substrate, realizes a display panel that can be bent and folded back.

CITATION LIST

Patent Literature

[Patent Literature 1]
Japanese Patent Application Publication No. 2003-257325
[Patent Literature 2]
Japanese Patent Application Publication No. 2003-280546

SUMMARY

Technical Problem

Meanwhile, there is increasing demand for extending the operation lifetime of organic EL devices. This is since, organic EL devices with longevity are required to realize stable, long-term operation of display devices, etc., including organic EL devices. For example, degradation of an organic EL device occurs when moisture, oxygen, etc., enter an organic EL portion of the organic EL device. Typically, an organic EL portion includes a light emission layer and an electrode, and when moisture, oxygen, etc., enter the organic EL portion, degradation of the light emission layer and the electrode occurs. This results in a great decrease in the luminance of the organic EL device. Based on this, assumption can be made that the demand for organic EL devices with longevity can be satisfied by suppressing entry of moisture, oxygen, etc., into the organic EL portion of organic EL devices. That is, assumption can be made that organic EL devices with longevity can be realized by improving the sealing property of organic EL devices.

In view of the above, the present disclosure provides an organic EL device having improved sealing property.

Solution to Problem

One aspect of the present invention is an organic EL device including: a substrate having flexibility; an organic EL portion disposed above a first region of the substrate; wiring disposed above the substrate and connected to the organic EL portion; an externally-connecting terminal disposed above a second region of the substrate differing from the first region, the externally-connecting terminal being electrically connected with the organic EL portion via the wiring, at least a portion of the externally-connecting terminal to be connected with an external drive circuit for driving the organic EL device; an inorganic sealing film mainly containing an inorganic material and covering the organic EL portion; and a resin sealing film mainly containing a resin material and covering the inorganic sealing film, at least a part of the resin sealing film being in contact with the inorganic sealing film. In the organic EL device pertaining to one aspect of the present invention, the substrate has a bend portion between the first region and the second region, the bend portion corresponding to a predetermined portion of the organic EL device at which the organic EL device is to be bent, and an end of the inorganic sealing film in a direction of the externally-connecting terminal does not extend over the bend portion towards the externally-connecting terminal, and an end of the resin sealing film in the direction of the externally-connecting terminal extends over the bend portion towards the externally-connecting terminal but does not extend over said portion of the externally-connecting terminal to be connected with an external drive circuit.

Advantageous Effects

In the organic EL device pertaining to one aspect of the present invention, the end of the inorganic sealing film in the direction of the externally-connecting terminal does not extend over the bend portion towards the externally-connecting terminal. Due to this, degradation of sealing property of the organic EL device occurring due to cracking of the inorganic sealing film is suppressed.

In the organic EL device pertaining to one aspect of the present invention, the end of the resin sealing film in the direction of the externally-connecting terminal extends over the bend portion towards the externally-connecting terminal but does not extend over said portion of the externally-connecting terminal to be connected with an external drive circuit. Due to this, the distance between the organic EL portion and the end of the resin sealing film in the direction of the externally-connecting terminal is relatively great. Thus, entry of moisture, oxygen, etc., into the organic EL portion from along an interface between the sealing film and another layer is suppressed. As such, the organic EL device pertaining to one aspect of the present invention has excellent sealing property.

DESCRIPTION OF EMBODIMENTS

[How Present Inventor Arrived at Aspect of Present Invention]

Before providing specific description on one aspect of the present invention, explanation is provided of how the present inventor arrived at one aspect of the present invention.

The demand for organic EL devices with longevity is growing, with organic EL devices being widely used, for example, in display devices and light sources. The circumstances being such, the present inventor attempted to satisfy the demand for such organic EL devices by providing an organic EL device in which entry of moisture, oxygen, etc., into an organic EL portion including a light emission layer and an electrode is suppressed.

[Overview of Aspect of Present Invention]

One aspect of the present invention is an organic EL device including: a substrate having flexibility; an organic EL portion disposed above a first region of the substrate; wiring disposed above the substrate and connected to the organic EL portion; an externally-connecting terminal disposed above a second region of the substrate differing from the first region, the externally-connecting terminal being electrically connected with the organic EL portion via the wiring, at least a portion of the externally-connecting terminal to be connected with an external drive circuit for driving the organic EL device; an inorganic sealing film mainly containing an inorganic material and covering the organic EL portion; and a resin sealing film mainly containing a resin material and covering the inorganic sealing film, at least a part of the resin sealing film being in contact with the inorganic sealing film. In the organic EL device pertaining to one aspect of the present invention, the substrate has a bend portion between the first region and the second region, the bend portion corresponding to a predetermined portion of the organic EL device at which the organic EL device is to be bent, and an end of the inorganic sealing film in a direction of the externally-connecting terminal does not extend over the bend portion towards the externally-connecting terminal, and an end of the resin sealing film in the direction of the externally-connecting terminal extends over the bend portion towards the externally-connecting terminal but does not extend over said portion of the externally-connecting terminal to be connected with an external drive circuit.

Due to the organic EL device pertaining to one aspect of the present invention having the above-described structure, degradation of sealing property of the organic EL device occurring due to cracking of the inorganic sealing film is suppressed.

In addition, in the organic EL device pertaining to one aspect of the present invention, the distance between the organic EL portion and the end of the resin sealing film in the direction of the externally-connecting terminal is relatively great. Thus, entry of moisture, oxygen, etc., into the organic EL portion from along an interface between the sealing film and another layer is suppressed.

In the organic EL device pertaining to one aspect of the present invention, for instance, the wiring may include a portion above the bend portion, the portion of the wiring being covered by the resin sealing film.

When the organic EL device pertaining to one aspect of the present invention has the above-described structure, stress force is exerted on both the wiring and the resin sealing film when the organic EL device is bent at the predetermined potion corresponding to the bend portion. Thus, the stress force exerted on the wiring is moderated.

The organic EL device pertaining to one aspect of the present invention, for instance, may further include: a drive chip for driving the organic EL portion, the drive chip having an input terminal and an output terminal, and the wiring may be composed of a first wiring and a second wiring, the first wiring extending from the externally-connecting terminal and connected to the input terminal of the drive chip, the second wiring leading out from the organic EL portion and connected to the output terminal of the drive chip, and the drive chip may be disposed above the substrate away from the bend portion in the direction of the externally-connecting terminal and is covered by the resin sealing film.

When having the above-described structure, the organic EL device pertaining to one aspect of the present invention has improved sealing property.

In the organic EL device pertaining to one aspect of the present invention, for instance, the wiring may be composed of a first wiring and a second wiring, the first wiring extending from the externally-connecting terminal, the second wiring leading out from the organic EL portion, and the externally-connecting terminal may be composed of a first layer and a second layer on the first layer, the first layer having the same thickness as each of the first wiring and the second wiring.

When the organic EL device pertaining to one aspect of the present invention has the above-described structure, the externally-connecting terminal has relatively great strength, and the connection with the external drive circuit is performed with a higher degree of certainty.

The organic EL device pertaining to one aspect of the present invention, for instance, may further include: a peripheral inorganic sealing film mainly containing an inorganic material, the peripheral inorganic sealing film disposed above the substrate away from the bend portion in the direction of the externally-connecting terminal.

When having the above-described structure, the organic EL device pertaining to one aspect of the present invention is ensured to have excellent sealing property, particularly at a region thereof in the direction of the externally-connecting terminal from the bend portion.

In the organic EL device pertaining to one aspect of the present invention, for instance, the organic EL portion may include a first organic EL region and a second organic EL region, the substrate may also have a bend portion between the first organic EL region and the second organic EL region, the bend portion between the first organic EL region and the second organic EL region corresponding to another predetermined portion of the organic EL device at which the organic EL device is to be bent, and the inorganic sealing film may not be formed above the bend portion between the first organic EL region and the second organic EL region.

When having the above-described structure, the organic EL device pertaining to one aspect of the present invention, while having two organic EL regions and being bendable between the two organic EL regions, has improved sealing property.

In the organic EL device pertaining to one aspect of the present invention, for instance, the resin sealing film may not be formed above the bend portion between the first organic EL region and the second organic EL region.

When the organic EL device pertaining to one aspect of the present invention has the above-described structure, stress force exerted on the organic EL device pertaining to one aspect of the present invention when bent, which is likely to be exerted on the bend portion, is moderated by the resin sealing film.

EMBODIMENTS

Embodiment 1

In the following, description is provided on an organic EL display panel, with reference to the accompanying drawings. Here, an organic EL display panel is taken as one example of the organic EL device pertaining to one aspect of the present invention. Note that the drawings are schematic drawings provided for the mere sake of explanation. Therefore, in the drawings, thickness of elements, the ratio between sizes of elements, etc., may not be accurate in a strict sense. Further, in the drawings, the same reference signs are provided to elements that are substantially the same.

Note that in the present disclosure, the term "bend portion" refers to a predetermined portion at which an organic EL display panel (or more specifically, a flexible substrate included in an organic EL display panel) is to be bent. In specific, a bend portion refers to a portion of an organic EL display panel (a flexible substrate) that has the smallest radius of curvature when the organic EL display panel is bent, or a portion of an organic EL display panel (a flexible substrate) that has a radius of curvature smaller than or equal to 50 mm when the organic EL display panel is bent.

Particularly, in embodiment 1, description is provided on a case where an organic EL display panel 100 (or more specifically, a flexible substrate 101 included in the organic EL display panel 100) is to be bent (folded back) at the bend portion such that the direction in which the organic EL display panel 100 (the flexible substrate 101) extends differs by 180 degrees at both sides of the bend portion. As such, in embodiment 1, the bend portion is referred to as a "fold-back portion".

1. Overall Structure

Figure 1:
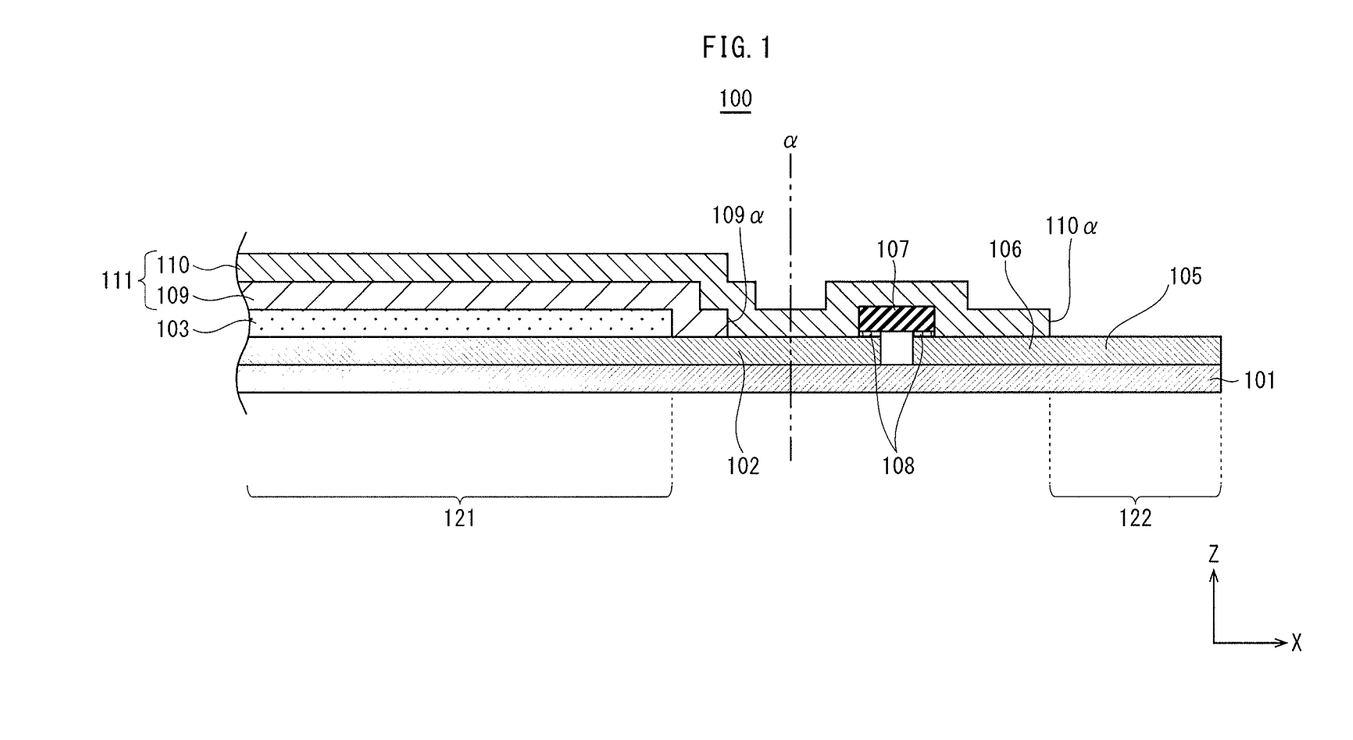
FIG. 1 is a cross-sectional diagram of an organic EL display panel in embodiment 1.

As illustrated in the cross-sectional diagram of FIG. 1, an organic EL display panel 100 pertaining to embodiment 1 includes: the flexible substrate 101; an organic EL portion 103 that is disposed above the flexible substrate 101; an externally-connecting terminal 105 that is disposed above the flexible substrate 101 and is connected to the organic EL portion 103 via wiring; and a sealing film 111 covering the organic EL portion 103.

The sealing film 111 includes: an inorganic sealing film 109; and a resin sealing film 110. The inorganic sealing film 109 covers the organic EL portion 103. An end 109α of the inorganic sealing film 109 in the direction of the externally-connecting terminal 105 does not extend over a fold-back portion aof towards the externally-connecting terminal 105, and thus, is located in the direction of the organic EL portion 103 from the fold-back portion α. Here, the end 109α of the inorganic sealing film 109 in the direction of the externally-connecting terminal 105 refers to an end of the inorganic sealing film 109 that is located relatively close to the externally-connecting terminal 105, among the two ends of the inorganic sealing film 109.

Meanwhile, an end 110α of the resin sealing film 110 in the direction of the externally-connecting terminal 105 extends over the fold-back portion towards the externally-connecting terminal 105, and thus, is located in the direction of the externally-connecting terminal 105 from the fold-back portion α.

As such, at the fold-back portion α, the resin sealing film 110 covers the flexible substrate 101, while the inorganic sealing film 109 does not exist between the flexible substrate 101 and the resin sealing film 110.

The organic EL display panel 100 further includes: a first wiring 106 extending from the externally-connecting terminal 105; a second wiring 102 leading out from the organic EL portion 103; and a drive chip 107 that amplifies voltage input from the first wiring 106. Note that, at the fold-back portion α, one of the first wiring 106 and the second wiring 102, which electrically connect the externally-connecting teiminal 105 and the organic EL portion 103, is formed above the flexible substrate 101.

The organic EL portion 103 includes: a TFT layer that is composed of a plurality of thin film transistors (TFTs) and a planarizing film; an anode; a light emission layer; and a cathode. The TFTs have electrodes to which the second wiring 102, which includes a select line, a power source line, a signal line, etc., is connected. Note that the organic EL display panel 100 is a top emission type organic EL display panel. Thus, light from the light emission layer exits the organic EL display panel 100 from a side opposite the flexible substrate 101. In the following, description is provided on the structure of each element of the organic EL display panel 100.

2. Structures of Elements (Flexible Substrate)

The flexible substrate 101 is composed of a conventional resin material. For example, the flexible substrate 101 may be composed of polyimide. It is plausible that the flexible substrate 101 has a thickness between 10 µm and 300 µm. For example, the flexible substrate 101 may have a thickness of 38 µm.

(Externally-Connecting Terminal and Wiring)

The externally-connecting terminal 105, the first wiring 106, and the second wiring 102, all of which are disposed above the flexible substrate 101, are formed by using the same material. For example, the externally-connecting terminal 105, the first wiring 106, and the second wiring 102 are each formed by layering an indium oxide layer on an Al alloy layer. In such a case, the Al alloy layer may have a thickness of 200 nm, and the indium oxide layer may have a thickness of 20 nm. Note that the externally-connecting terminal 105, the first wiring 106, and the second wiring 102 need not be formed from the same material. That is, the externally-connecting terminal 105, the first wiring 106, and the second wiring 102 may each be formed from a different material.

The externally-connecting terminal 105 is a portion of the first wiring 106 leading out from the drive chip 107, particularly a portion that is not covered by the sealing film 111. Further, a region of organic EL display panel 100 where the externally-connecting terminal 105 is disposed above the flexible substrate 101 is a connection region 122. The externally-connecting terminal 105 is connected to an external drive circuit for driving the organic EL display panel 100 by, for example, nipping the externally-connecting terminal 105, which is not covered by the sealing film 111, and the flexible substrate 101 at the connection region 122 by using a clip provided to an end portion of the external drive circuit. By performing connection by using a clip as described above, the organic EL display panel 100 is connected to the external drive circuit at the connection region 122.

The first wiring 106 is connected to an input terminal of the drive chip 107, and has the function of outputting voltage input from the external drive circuit to the drive chip 107.

The second wiring 102 is connected to an output terminal of the drive chip 107, and has the function of outputting voltage input from the drive chip 107 to electrodes of the TFTs included in the organic EL portion 103.

(Organic EL Portion)

The organic EL portion 103 includes the light emission layer and a pair of electrodes between which the light emission layer is interposed. Note that a light emission layer and a pair of electrodes are provided for each pixel of the organic EL display panel 100. Further, a region of the organic EL display panel 100 where the organic EL portion 103 is disposed above the flexible substrate 101 is a display region 121. The organic EL portion 103 displays a desired image when the light emission layers in the organic EL portion 103 emit light by voltage being applied between the electrode pairs. For example, the organic EL portion 103 includes the TFT layer, the anode, and a barrier wall that is formed above the TFT layer and that partitions the anode into portions each corresponding to one pixel of the organic EL display panel 100. The TFT layer includes a plurality of TFTs and the planarizing layer, as already described above. Further, a hole transport layer, the light emission layer, which is an electron-transporting light emission layer for example, and an electron injection layer are layered above each of the portions of the anode corresponding to one pixel. In addition, the organic EL portion 103 includes the cathode, which extends covering all pixels of the organic EL display panel 100.

(Drive Chip)

For example, the drive chip 107 is an IC chip. The input terminal of the drive chip 107 is connected to the first wiring 106. The output terminal of the drive chip 107 is connected to the second wiring 102. Thus, the drive chip 107 is electrically connected to the organic EL portion 103. Note that the input terminal and the output terminal of the drive chip 107 are respectively connected to the first wiring 106 and the second wiring 102 via adhesion portions 108. For example, the adhesion portions 108 may be formed by using solder or an anisotropic conductive adhesive.

(Inorganic Sealing Film, Resin Sealing Film)

The inorganic sealing film 109 is made of an inorganic material. One example of the inorganic material is silicon nitride. For example, the inorganic sealing film 109 may have a thickness of 2 µm. The resin sealing film 110 is made of a resin material. One example of the resin material is epoxy resin. For example, the resin sealing film 110 may have a thickness of 20 µm. Note that the inorganic sealing layer 109 need not be composed of only an inorganic material. Other materials may be included, as long as the inorganic sealing layer 109 mainly contains an inorganic material. Similarly, the resin sealing layer 110 need not be composed of only a resin material. Other materials may be included, as long as the resin sealing layer 109 mainly contains a resin material. The resin sealing film 110 covers the drive chip 107, which is disposed in the direction of the externally-connecting terminal 105 from the fold-back portion α. Thus, the organic EL display panel 100 has improved sealing property.

Figure 2A:
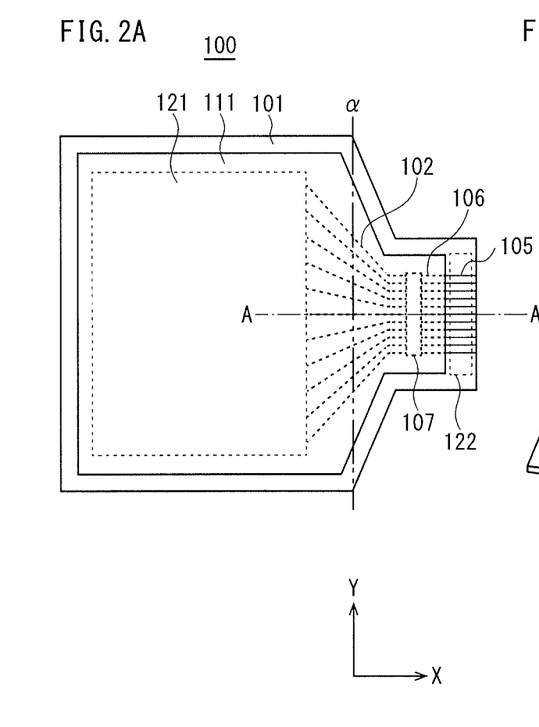
FIG. 2A illustrates an upper surface of the organic EL display panel in embodiment 1.
Figures 2B, 2C:
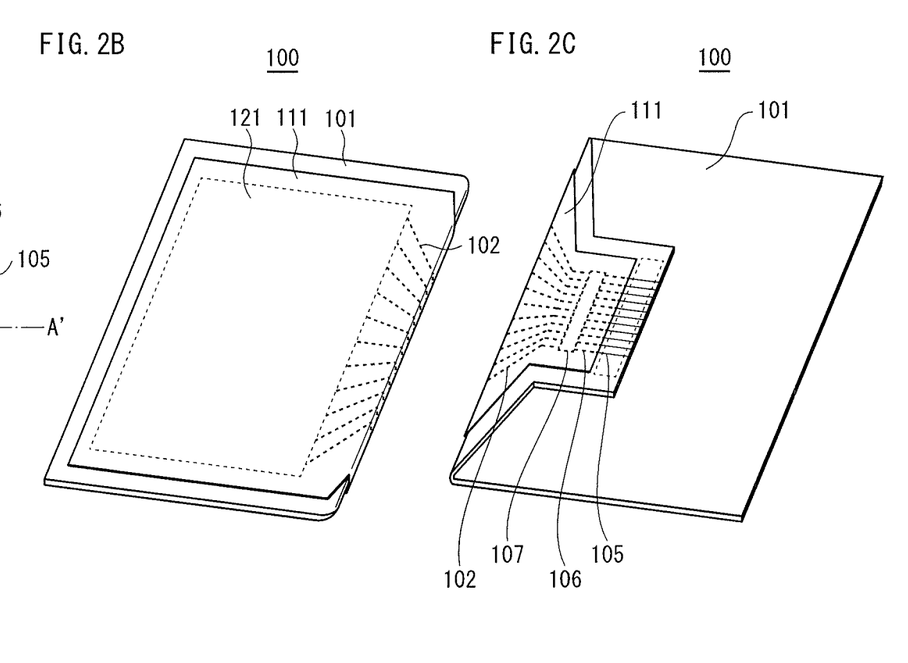
FIG. 2B is a perspective view illustrating a state of the organic EL display panel in FIG. 2A folded back at or near a connection region, when viewed from a side of a display region.
FIG. 2C is a perspective view illustrating a state of the organic EL display panel in FIG. 2A folded back at or near the connection region, when viewed from a side opposite the side of the display region.

Next, description is provided on how the organic EL display panel 100 is to be folded back, with reference to FIGS. 2A through 2C. FIG. 2A illustrates an upper surface of the organic EL display panel 100. Note that FIG. 1 is a cross-sectional diagram taken along line A-A' in FIG. 2A. FIG. 2B is a perspective view illustrating the organic EL display panel 100 when viewed from a side of the display region. FIG. 2C is a perspective view illustrating the organic EL display panel 100 when viewed from a side opposite the side of the display region. Note that the organic EL display panel 100 in embodiment 1 is driven according to the active matrix method.

The organic EL display panel 100 has the display region 121, the connection region 122, and the fold-back portion α, which is located between the display region 121 and the connection region 122. The organic EL display panel 100 is to be folded back at the fold-back portion α. FIGS. 2B and 2C illustrate the organic EL display panel 100 folded back at the fold-back portion α. When the organic EL display panel 100 is folded back in such a manner, the drive chip 107 and the connection region 122 are located on a side of the flexible substrate 101 opposite the side of the display region 121.

3. Observation of Sealing Structure

As illustrated in FIG. 1, within the display region 121, the organic EL portion 103 and the inorganic sealing film 109, which covers the organic EL portion 103, are disposed above the substrate 101. Further, within the display region 121, the inorganic sealing film 109 is covered by the resin sealing film 110. Here, note that in order to suppress damage to the organic EL portion 103 when the organic EL display panel 100 is folded back, the organic EL portion 103 is not disposed above the flexible substrate 101 at the fold-back portion α.

Further, it should also be noted that in order to suppress degradation of the sealing property of the organic EL display panel 100 at the organic EL portion 103 occurring, the inorganic sealing film 109 is not disposed above the flexible substrate 101 at the fold-back portion α. That is, if the inorganic sealing film 109 were disposed above the flexible substrate 101 at the fold-back portion α, there is risk of the inorganic sealing film 109 cracking at the fold-back portion α when the organic EL display panel 100 is folded back. In such a case, the cracking of the inorganic sealing film 109 may progress further until degradation of the sealing property of the organic EL display panel 100 at the organic EL portion 103 occurs. To suppress such degradation, in the organic EL display panel 100, the inorganic sealing film 109 is not disposed above the flexible substrate 101 at the fold-back portion α.

Here, note that the inorganic sealing film 109 is made of material having lower flexibility compared to the material that the flexible substrate 101 is made of and the material that the resin sealing film 110 is made of. In the present embodiment, description is provided on the material that the sealing film 111, which includes the inorganic sealing film 109 and the resin sealing film 110, is made of. However, the sealing film 111 is not limited to being formed by using the specific material described in the present embodiment. That is, the sealing film 111 (i.e., the inorganic sealing film 109 and the resin sealing film 110) may be formed by using any material, as long as the organic EL display panel 100 has a first sealing film covering the organic EL portion 103 and a second sealing film having greater flexibility than the first sealing film.

Further, the resin sealing film 110 is disposed above the flexible substrate 101 at the fold-back portion α. When the organic EL display panel 100 is folded back at the fold-back portion α, strong stress force is likely to be exerted on the organic EL display panel 100 particularly at the fold-back portion α. In view of this, the resin sealing film 110 is disposed above the flexible substrate 101 at the fold-back portion α so that stress force exerted on the second wiring 102, which is disposed above the flexible substrate 110 at the fold-back portion α, is moderated.

Further, the resin sealing film 110 extends over the fold-back portion α towards the externally-connecting terminal 105.

Here, it should be noted that in order to increase the sealing property of the organic EL display panel 100 and to suppress entry of moisture, oxygen, etc., into the organic EL portion 103, it is plausible to increase the distance between end portions of the sealing film 111 and the organic EL portion 103.

According to conventional technology, a sealing film may be disposed over a great region above a substrate, so as to cover an organic EL portion. However, an externally-connecting terminal for electrically connecting an organic EL portion and an external drive circuit cannot be covered by the sealing film, since the externally-connecting terminal needs to be exposed. Meanwhile, the externally-connecting terminal is typically located in the direction of the organic EL portion from a fold-back portion. Here, the fold-back portion refers to a portion where an FPC is to be folded back. Due to this, an end portion of the sealing film in the direction of the FPC is located in the direction of the organic EL portion from the fold-back portion.

In contrast, in the organic EL display panel 100 pertaining to the present embodiment, the flexible substrate 101 is used as the substrate. Thus, there is no need of preparing a separate FPC for wiring connection, and the function of such an FPC is included in the flexible substrate 101. Further, the present inventor found that, by forming the organic EL portion 103 and the externally-connecting terminal 105 on the flexible substrate 101 characterized as described above, the sealing film 111 covering and sealing the organic EL portion 103 can be extended in the direction of the externally-connecting terminal 105 so far as the sealing film 111 does not extend over the externally-connecting terminal 105 (i.e., does not extend into the connection region 122). Specifically, the organic EL display panel 100 has a region where the organic EL portion 103 is disposed above the flexible substrate 101 and a region where the externally-connecting terminal 105 is disposed above the flexible substrate. Further, the organic EL display panel 100 is to be folded back at the fold-back portion α, which is between the two regions. In the organic EL display panel 100, the resin sealing film 110 extends over the fold-back portion towards the externally-connecting terminal 105. Due to this, an organic EL device having improved sealing property is provided, in which entry of moisture, oxygen, etc., into an organic EL portion is suppressed.

Figure 3A:
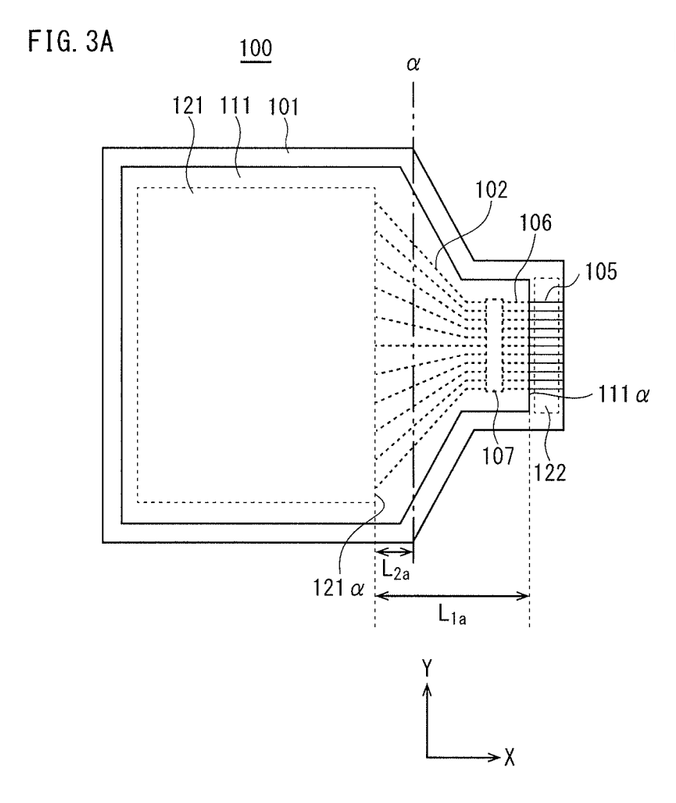
FIG. 3A illustrates the upper surface of the organic EL display panel in embodiment 1.
Figure 3B:
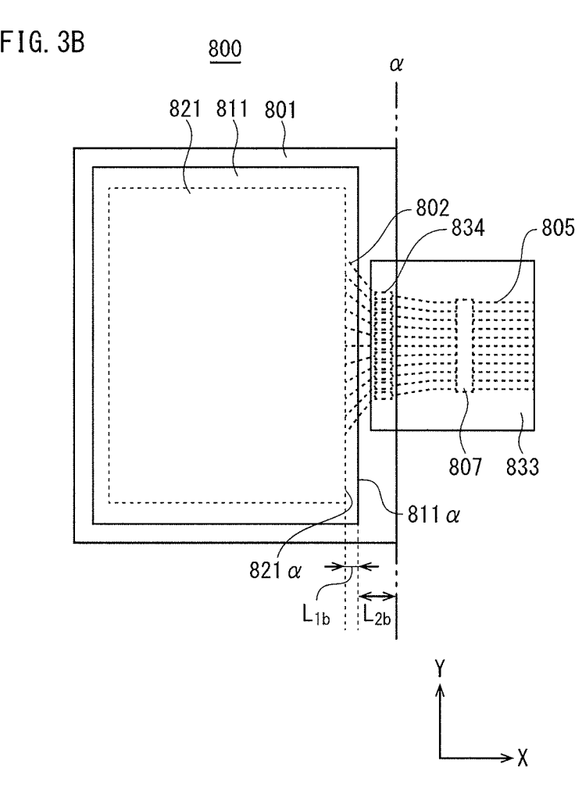
FIG. 3B illustrates an upper surface of an organic EL display panel pertaining to a comparative example.

Next, description is provided on the structure of sealing provided to the organic EL display panel 100, with reference to FIGS. 3A and 3B. FIG. 3A illustrates the upper surface of the organic EL display panel 100 illustrated in FIG. 1, and FIG. 3B illustrates an upper surface of an organic EL display panel 800 pertaining to a comparative example. A substrate and an externally-connecting terminal in the comparative example structurally differ from the flexible substrate 101 and the externally-connecting terminal 105 in the present embodiment, respectively. In the present embodiment, the externally-connecting terminal 105 is disposed above the flexible substrate 101. Meanwhile, in the comparative example, the externally-connecting terminal is disposed above an FPC. Further, in the comparative example, the FPC and a flexible substrate are connected via an anisotropic conductive film (hereinafter referred to as an "ACF"). Note that unless otherwise stated, description is provided in the following based on the assumption that elements in the present invention and the corresponding elements in the comparative example are similar in terms of thickness, material thereof, etc.

In the organic EL display panel 100, it is required that, at the connection region 122, the externally-connecting terminal 105 is not covered, in order to enable connection of the externally-connecting terminal 105 to the external drive circuit. Due to this, the sealing film 111 does not extend into the connection region 122, while extending over other regions of the organic EL display panel 100 above the flexible substrate 101. In specific, the sealing film 111 covers the display region 121, and further, extends over the fold-back portion α towards the externally-connecting terminal 105.

Meanwhile, the organic EL display panel 800 includes a flexible substrate 801. Further, the organic EL display panel 800 is to be folded back at a fold-back portion α illustrated in FIG. 3B. Further, an ACF 834 connects the flexible substrate 801 and an FPC 833. The FPC 833 has an externally-connecting terminal 805, etc., disposed thereon. In the organic EL display panel 800, it is required that a region to which the ACF 834 is applied for connecting the flexible substrate 801 and the FPC 833 is not covered. Due to this, in the organic EL display panel 800, a sealing film 811 does not cover the region to which the ACF 834 is applied. In specific, the sealing film 811 covers the display region 821 but does not extend over the fold-back portion α. Thus, an end of the sealing film 811 in the direction of the externally-connecting terminal 805 is located in the direction of the display region 821 from the fold-back portion α.

Next, the sealing property of the organic EL display panel 100 pertaining to the present embodiment and the sealing property of the organic EL display panel 800 pertaining to the comparative example are considered. Typically, the degree of sealing achieved by sealing films changes depending upon the thickness of the sealing films and the area that the sealing films cover. That is, the greater the thickness of a sealing film, the higher the degree of sealing achieved, and the greater the area covered by a sealing film, the higher the degree of sealing achieved. When comparing the present invention and the comparative example, a difference in sealing property is observed, which results from the difference in the area covered by a sealing film. Detailed description on this point is provided in the following.

First of all, the sealing film 111 has four end portions that are parallel with the four sides of the display region 121, and the sealing film 821 has four end portions that are parallel with the four sides of the display region 821. When comparing positions of the corresponding end portions of the sealing film 111 and the sealing film 811, an end portion 111α of the sealing film 111 and an end portion 811α of the sealing film 821, which correspond to one another, are located at different positions. Note that the end portion 111α is one side of the sealing film 111 that is parallel with the fold-back portion α and that is located near the externally-connecting terminal 105. On the other hand, the end portion 811 α is one side of the sealing film 811 that is parallel with the fold-back portion α and that is located near the externally-connecting terminal 805. Here, it can be assumed that this difference in the positions of the end portions 111α and 811α results in a difference in the degree of sealing provided at and near an end portion 121α of the display region 121 and the degree of sealing provided at and near an end portion 821α of the display region 821. As already described above, the sealing film 111 in the organic EL display panel 100 extends over the fold-back portion α towards the externally-connecting terminal 105. In contrast, the sealing film 811 in the organic EL display panel 800 does not extend over the fold-back portion α, and thus, is located in the direction of the display region 821 from the fold-back portion α. Due to this, a distance $L_{1a}$ between the end portion 121α of the display region 121 and the end 111α of the sealing film 111 is greater than a distance $L_{1b}$ between the end portion 821α of the display region 821 and the end 811α of the sealing film 811. Here, note that a distance $L_{2a}$ between the end portion 121α and the fold-back portion α equals a distance $L_{2b}$ between the end portion 821α and the fold-back portion α. Such an arrangement where the distance $L_{2a}$ and the distance $L_{2b}$ are equal is made because it is plausible to reduce the distance between a display region and a fold-back portion α in an organic EL display panel to as small a distance as possible, in order to satisfy the demand for organic EL display panels having a slim bezel. As such, the distance between a display region and a fold-back portion α in an organic EL display panel is set to a predetermined value in the process of designing the organic EL display panel.

The greater the distance $L_{1a}$ between the end portion 121α of the display region 121 and the end 111α of the 111, the more the entry of moisture, oxygen, etc., into from the end 111α and along the interface between the sealing film 111 and another layer can be suppressed. As such, it can be concluded that the organic EL display panel 100 pertaining to the present embodiment has improved sealing property compared to the organic EL display panel 800 pertaining to the comparative example. Further, since the distance $L_{2a}$ in the organic EL display panel 100 is equal to the distance $L_m$ in the organic EL display panel 800, the organic EL display panel 100 also satisfies the demand for organic EL display panels having a slim bezel.

4. Effects Achieved

As described above, in the organic EL display panel 100, the end 109α of the inorganic sealing film 109 in the direction of the externally-connecting terminal 105 does not extend over the fold-back portion α, and thus, is located in the direction of the organic EL portion 103 from the fold-back portion α. Due to this, degradation of the sealing property of the organic EL display panel 100 occurring due to the cracking of the inorganic sealing film 109 is suppressed.

In addition, in the organic EL display panel 100, the end 110α of the resin sealing film 110 in the direction of the externally-connecting terminal 105 extends over the fold-back portion α, and thus, is located in the direction of the externally-connecting terminal 105 from the fold-back portion α. Thus, the organic EL display device 100 has excellent sealing property.

5. Other Matters

In the present embodiment, description has been provided on the premise that the fold-back portion α in the organic EL display panel 100 corresponds to the bend portion in the organic EL display device pertaining to one aspect of the present invention. However, the bend portion in the organic EL display device pertaining to one aspect of the present invention is not limited to a fold-back portion such as the fold-back portion α in the organic EL display panel 100, which is a portion of the organic EL display panel 100 where the organic EL display panel 100 is to be bent back 180 degrees (i.e., folded back). That is, the bend portion in the organic EL display device pertaining to one aspect of the present invention is a predetermined portion at which the organic EL display device pertaining to one aspect of the present invention is to be bent by a predetermined angle (e.g., 45 degrees). This applies to the following embodiments.

In addition, in terms of sealing property, it is preferable that in the organic EL display panel 100, the inorganic sealing film 109 is continuous above the organic EL portion 103, rather than being separated into multiple portions. The same applies to the resin sealing film 110. However, the organic EL display panel 100 may include the inorganic sealing film 109 and/or the resin sealing film 110 in plurality. For example, the inorganic sealing film 109, which does not extend over the fold-back portion α and thus is located in the direction of the organic EL portion 103 from the fold-back portion α (i.e., the bend portion), may be separated into multiple portions. Further, the organic EL display panel 100 may further include, in addition to the inorganic sealing film 109, a peripheral inorganic sealing film disposed in the direction of the externally-connecting terminal 105 from the fold-back portion α (i.e., the bend portion).

Further, with reference to FIG. 1, FIGS. 2A through 2C, and FIGS. 3A and 3B, description has been provided on an example of implementation where a flexible circuit includes the function of an FPC.

As already discussed above, conventional technology provides a structure where an FPC is provided for realizing connection with an external drive circuit, and a flexible substrate and the FPC are connected by using an ACF. It should be noted that this conventional structure is problematic in that there is a risk of the electrical connection between the flexible substrate and the FPC breaking when detachment of the ACF occurs. Under such a situation, the supply of power can no longer be performed. In contrast, the organic EL display panel 100 does not include such a connection formed by an ACF, and thus, the supply of power can be performed with a higher degree of certainty.

However, it should be noted that as a matter of course, the organic EL device pertaining to one aspect of the present invention is not limited to a flexible substrate having the function of an FPC, and encompasses a structure where a flexible substrate and a separate FPC are provided. In such a case, the FCP may be connected to an externally-connecting terminal via an ACF.

Embodiment 2

Figure 4:
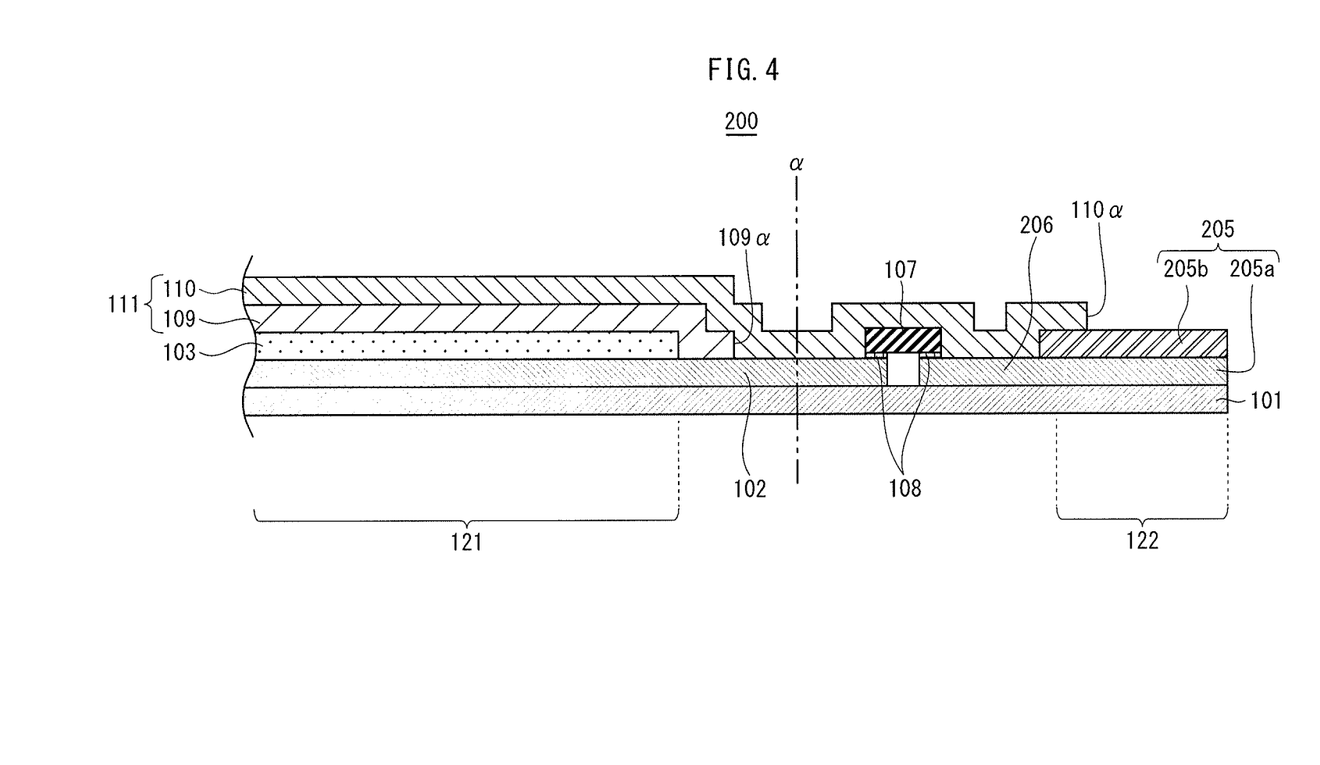
FIG. 4 is a cross-sectional diagram of an organic EL display panel in embodiment 2.

FIG. 4 is a cross-sectional diagram of an organic EL display panel in embodiment 2. The structure described in embodiment 2 differs from the structure described in embodiment 1 in that an externally-connecting terminal in embodiment 2 has a greater thickness than the externally-connecting terminal 105 in embodiment 1. Note that in the following, elements that are the same as those appearing in embodiment 1 are provided with the same reference signs as in embodiment 1.

1. Structure

An organic EL display panel 200 pertaining to embodiment 2 includes an externally-connecting terminal 205 and a first wiring 206, both of which are formed above the flexible substrate 101. The externally-connecting terminal 205 is composed of a first terminal portion 205a and a second terminal portion 205b disposed above the first terminal portion 205a. The first terminal portion 205a has the same thickness as each of the first wiring 206 and the second wiring 102.

The first wiring 206 and the first terminal portion 205a are similar to the first wiring 106, the second wiring 102, and the externally-connecting terminal 105 in embodiment 1 in that the first wiring 206 and the first terminal portion 205a have a structure where an indium oxide layer is layered on an Al alloy layer. For example, the Al alloy layer in each of the first wiring 206 and the first terminal portion 205a may have a thickness of 200 nm. For example, the indium oxide layer in each of the first wiring 206 and the first terminal portion 205a may have a thickness of 20 nm. Meanwhile, the second terminal portion 205b is composed of silver alloy. For example, the second terminal portion 205b may have a thickness of 4 µm. For example, the second terminal portion 205b may be formed by using conventional printing techniques.

2. Effects Achieved

In the organic EL display panel 200, the second terminal portion 205b is formed on the first terminal portion 205a. As such, the externally-connecting terminal 205, when seen as a whole, has greater thickness compared to the externally-connecting terminal 105 in embodiment 1. By being provided with relatively great thickness, the externally-connecting terminal 205, which is to be used for connection with an external drive circuit, is provided with a higher level of strength compared to the externally-connecting terminal 105. As such, the connection with the external drive circuit can be established with a higher degree of certainty compared to embodiment 1.

Here, note that the material that the second terminal portion 205b made of, i.e., silver alloy, has higher electrical conductivity than the material that the first terminal portion 205a is made of, i.e., AL alloy and indium oxide. Generally, electrical resistance of wiring decreases as the cross-sectional area of the wiring increases and increases as the length of the wiring increases. The externally-connecting terminal 205 is one type of wiring. Further, it can be said that the externally-connecting terminal 205 has greater cross-sectional area compared to the externally-connecting terminal 105, due to having greater thickness compared to the externally connecting terminal 105. As such, due to the externally-connecting terminal 205 including the first terminal portion 205a and the second terminal portion 205b layered on the first terminal portion 205a, the externally-connecting terminal 205 has smaller electrical resistance compared to the externally-connecting terminal 105.

Embodiment 3

Figure 5:
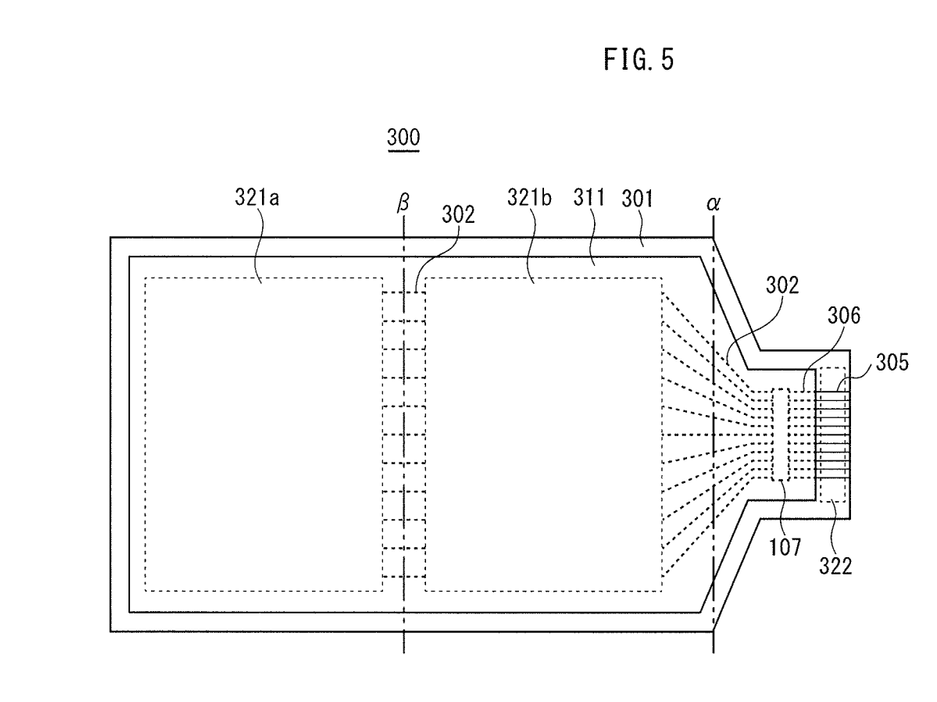
FIG. 5 illustrates an upper surface of an organic EL display panel in embodiment 3.
Figure 6:
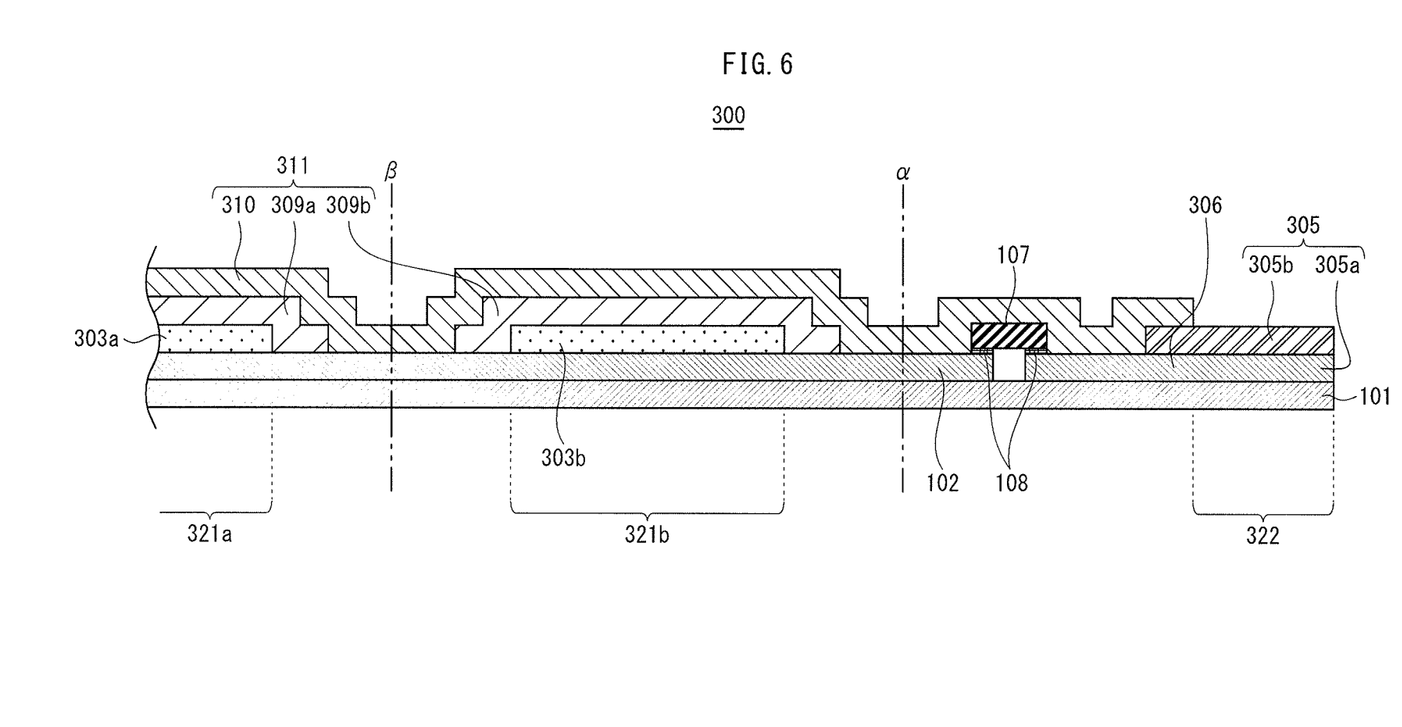
FIG. 6 is a cross-sectional diagram of the organic EL display panel in embodiment 3.

FIG. 5 illustrates an upper surface of an organic EL display panel in embodiment 3. FIG. 6 is a cross-sectional diagram of the organic EL display panel illustrated in FIG. 5. The organic EL display panel described in embodiment 3 differs from the organic EL display panels described in embodiments 1 and 2 for having two display regions, and for having two fold-back portions, which are indicated by α and β in FIGS. 5 and 6. Note that in the following, elements that are the same as those appearing in embodiments 1 and 2 are provided with the same reference signs as in embodiments 1 and 2.

1. Structure

As illustrated in FIG. 5, an organic EL display panel 300 pertaining to embodiment 3 has two display regions, i.e., display regions 321a and 321b. Further, the fold-back portion β exists between the two display regions 321a and 321b. The fold-back portion β is a portion at which the organic EL display panel 300 (or a flexible substrate 301 included in the organic EL display panel 300) is to be folded back. In the organic EL display panel 300, a resin sealing film 310 extends in the direction of an externally-connecting terminal 305 such that an end thereof in the direction of the externally-connecting terminal 305 extends over the fold-back portion α towards the externally-connecting terminal 305. Further, the externally-connecting terminal 305 includes a first terminal portion 305a and a second terminal portion 305b disposed above the first terminal portion 305a.

In addition, as illustrated in FIG. 6, the display region 321a of the organic EL display panel 300 includes, disposed above the flexible substrate 301, an organic EL portion 303a, an inorganic sealing film 309a covering the organic EL portion 303a, and the resin sealing film 310 covering the inorganic sealing film 309a. Similarly, the display region 321b includes, disposed above the flexible substrate 301, an organic EL portion 303b, an inorganic sealing film 309b covering the organic EL portion 303b, and the resin sealing film 310 covering the inorganic sealing film 309b. The inorganic sealing film 309a, the inorganic sealing film 309b, and the resin sealing film 310 compose a sealing film 311 in the organic EL display panel 300. Here, note that in order to suppress damage to organic EL portions 303a and 303b when the organic EL display panel 300 is folded back at the fold-back portion β, neither the organic EL portion 303a nor the organic EL portion 303b is disposed at the fold-back portion β. Further, it should also be noted that in order to suppress damage to the inorganic sealing films 309a and 309b when the organic EL display panel 300 is folded back at the fold-back portion β, neither the inorganic sealing film 309a nor the inorganic sealing film 309b is disposed at the fold-back portion β. By suppressing damage to the inorganic sealing films 309a and 309b when the organic EL display panel 300 is folded back at the fold-back portion β, the risk is suppressed of cracks that may otherwise be formed in the inorganic sealing films 309a and 309b when the organic EL display panel 300 is folded back at the fold-back portion β reaching the organic EL portions 303a and 303b. Thus, degradation of the sealing property of the organic EL display panel 300 at the organic EL portions 303a and 303b is suppressed.

Here, note that the materials that cathodes included in the organic EL portions 303a and 303b and the inorganic sealing films 309a and 309b are made of have lower flexibility compared to the materials that the flexible substrate 301 and the resin sealing film 310 are made of.

In addition, when the organic EL display panel 300 is folded back at the fold-back portions α and β, strong stress force is likely to be exerted on the organic EL display panel 300, or more particularly, on the flexible substrate 301. However, due to the resin sealing film 310 being disposed above the flexible substrate 301 at the fold-back portions α and β, the stress exerted on the flexible substrate 301 when the organic EL display panel 300 is folded back is moderated. In addition, when wiring is formed above the flexible substrate 301 at the fold-back portions α and β, the stress exerted on such wiring when the organic EL display panel 300 is folded can be moderated, whereby damage to such wiring can be suppressed.

2. Effects Achieved

As such, the organic EL display panel 300 is provided, which has the two display regions 321a and 321b and is foldable between the two display regions 321a and 321b.

Modifications

In addition to the forms of implementation described in the above embodiments, the following modifications may also be made.

1. Organic EL Display Panel

In the embodiments, etc., description is provided on organic EL display panels that are driven according to the active matrix method. However, the present disclosure is not limited to this, and may be applied to organic EL display panels driven according to the passive matrix method, for example. In a passive matrix organic EL display panel, an element corresponding to wiring in an active matrix organic EL display panel functions as an anode.

Although no specific description has been provided on the color of light emitted by organic light emission layers in the embodiments, etc., it should be noted that the present disclosure is applicable to both organic EL display panels that perform single color displaying and organic EL display panels that perform full color displaying. In a full color organic EL display panel, a portion corresponding to one light emission layer corresponds to one subpixel. Further, a full color organic EL display panel includes subpixels of the colors R, G, and B, and a pixel is formed by a combination of a subpixel of the color R, a subpixel of the color G, and a subpixel of the color B, which are disposed adjacent to each other. Further, such pixels are arranged in a matrix, whereby a display region composed of pixel units is formed.

In the embodiments, etc., description is provided taking top-emission type organic EL display panels as examples. However, the present disclosure is not limited to this, and is similarly applicable to bottom-emission type organic EL display panels.

2. Drive Chip

In the embodiments, etc., description is provided on organic EL display panels having a single drive chip. However, the present disclosure is not limited to this, and an organic EL display panel may have multiple drive chips. By providing an organic EL display panel with multiple drive chips, an organic EL display panel having a large-size screen can be provided. In addition, in the embodiments, etc., the number of input terminals provided to a drive chip equals the number of output terminals provided to a drive chip. However, the present disclosure is not limited to this, and is applicable to an organic EL display panel including a drive chip having a different number of input terminals and output terminals.

Further, in the embodiments, etc., a drive chip is connected to wiring disposed above a flexible substrate by means of soldering. However, the present disclosure is not limited to this, and for example, is applicable to a case where a drive chip is provided to an external drive circuit instead of being disposed above a flexible substrate.

3. Connection with External Drive Circuit

In the embodiments, etc., description is provided on a structure where an organic EL display panel is connected to an external drive circuit by nipping an externally-connecting terminal, which is not covered by a sealing film, and a flexible substrate at a connection region by using a clip provided to an end portion of the external drive circuit However, the present disclosure is not limited to this, and an organic EL display panel may be connected to an external drive circuit by, for example, adhering an externally-connecting terminal and wiring provided to an external drive circuit by using an anisotropic conductive adhesive.

4. Sealing Structure

In the embodiments, etc., description is provided on a structure where wiring including a connection wiring, a select line, etc., is directly disposed on a flexible substrate. However, the present disclosure is not limited to this, and a barrier layer composed of silicon nitride, which has a characteristic of blocking moisture, and a planarizing film composed of acrylic resin may be formed above the flexible substrate and the wiring. When provided with such a structure, the organic EL display panel has improved sealing property.

In addition, in the embodiments, etc., an organic EL display panel is ensured to have a certain level of sealing property at an organic EL portion by covering the organic EL portion with a sealing film composed of an inorganic sealing film and a resin sealing film. However, the present disclosure is not limited to this, and another flexible substrate may be disposed above the resin sealing film. When providing an organic EL display panel with such a structure, the sealing property of the organic EL display panel can be improved to a further extent.

5. Application of Present Disclosure

In the embodiments, etc., description is provided on an organic EL device pertaining to one aspect of the present invention while taking an organic EL display panel as an example of the organic EL device pertaining to one aspect of the present invention. However, the present disclosure is not limited to this, and the organic EL device pertaining to one aspect of the present invention can be implemented as a lighting device, etc.

INDUSTRIAL APPLICABILITY

The organic EL device pertaining to one aspect of the present invention is useful, for example, in (i) image display devices having flexibility, such as a full-color display or a segment display device, (ii) information display devices such as a portable terminal, (iii) light sources for printers, and (iv) lighting devices.

REFERENCE SIGNS LIST 100, 200, 300, 800 organic EL display panel
900 display panel
101, 301, 801 flexible substrate
102 second wiring
802 wiring
103, 303a, 303b organic EL portion
105, 205, 305, 805 externally-connecting terminal
205a, 305a first terminal portion 205b, 305b second terminal portion
106, 206, 306 first wiring
107 drive chip
108 connection portion
109, 309a, 309b inorganic sealing film
110, 310 resin sealing film
111, 311, 811 sealing film
121, 321a, 321b, 821 display region
122 connection region
833, 903 flexible print circuit (FPC)
901 glass substrate
902 externally-connecting terminal
903a base film
903b connection wiring
903c cover film
904 anisotropic conductive adhesive
905 adhesive
906, 907 sealing member
α, β fold-back portion (bend portion)

The invention claimed is:

1. An organic EL device comprising:
a substrate having flexibility;
an organic EL portion disposed above a first region of the substrate;
wiring disposed above the substrate and connected to the organic EL portion;
an externally-connecting terminal disposed above a second region of the substrate differing from the first region, the externally-connecting terminal being electrically connected with the organic EL portion via the wiring, at least a portion of the externally-connecting terminal to be connected with an external drive circuit for driving the organic EL device;
an inorganic sealing film mainly containing an inorganic material and covering the organic EL portion; and
a resin sealing film mainly containing a resin material and covering the inorganic sealing film, at least a part of the resin sealing film being in contact with the inorganic sealing film, wherein
the substrate has a bend portion between the first region and the second region, the bend portion corresponding to a predetermined portion of the organic EL device at which the organic EL device is to be bent, and
an end of the inorganic sealing film in a direction of the externally-connecting terminal does not extend over the bend portion towards the externally-connecting terminal, and an end of the resin sealing film in the direction of the externally-connecting terminal extends over the bend portion towards the externally-connecting terminal but does not extend over said portion of the externally-connecting terminal to be connected with an external drive circuit.

2. The organic EL device of claim 1, wherein
the wiring includes a portion above the bend portion, the portion of the wiring being covered by the resin sealing film.

3. The organic EL device of claim 1 further comprising:
a drive chip for driving the organic EL portion, the drive chip having an input terminal and an output terminal, wherein
the wiring is composed of a first wiring and a second wiring, the first wiring extending from the externally-connecting terminal and connected to the input terminal of the drive chip, the second wiring leading out from the organic EL portion and connected to the output terminal of the drive chip, and
the drive chip is disposed above the substrate away from the bend portion in the direction of the externally-connecting terminal and is covered by the resin sealing film.

4. The organic EL device of claim 1, wherein
the wiring is composed of a first wiring and a second wiring, the first wiring extending from the externally-connecting terminal, the second wiring leading out from the organic EL portion, and
the externally-connecting terminal is composed of a first layer and a second layer on the first layer, the first layer having the same thickness as each of the first wiring and the second wiring.

5. The organic EL device of claim 1 further comprising:
a peripheral inorganic sealing film mainly containing an inorganic material, the peripheral inorganic sealing film disposed above the substrate away from the bend portion in the direction of the externally-connecting terminal.

6. The organic EL device of claim 1, wherein
the organic EL portion includes a first organic EL region and a second organic EL region,
the substrate also has a bend portion between the first organic EL region and the second organic EL region, the bend portion between the first organic EL region and the second organic EL region corresponding to another predetermined portion of the organic EL device at which the organic EL device is to be bent, and
the inorganic sealing film is not formed above the bend portion between the first organic EL region and the second organic EL region.

7. The organic EL device of claim 6, wherein
the resin sealing film is formed above the bend portion between the first organic EL region and the second organic EL region.

* * * * *